United States Patent [19]

Michel

[11] Patent Number: 4,544,845
[45] Date of Patent: Oct. 1, 1985

[54] ELECTRON GUN WITH A FIELD EMISSION CATHODE AND A MAGNETIC LENS

[75] Inventor: Troyon E. Michel, Reims, France

[73] Assignee: University de Reims Champagne Ardenne, Reims, France

[21] Appl. No.: 494,574

[22] Filed: May 13, 1983

[30] Foreign Application Priority Data

May 24, 1982 [FR] France .................. 82 08952

[51] Int. Cl.[4] .............................................. H01J 37/73
[52] U.S. Cl. ........................ 250/396 R; 250/396 ML; 250/423 F
[58] Field of Search ........ 250/396 ML, 396 R, 423 F; 313/361, 363, 336

[56] References Cited

U.S. PATENT DOCUMENTS 3,509,503 4/1970 Yanaka et al. .
3,678,333 7/1972 Coutes et al. .................. 250/396 R
3,862,419 1/1975 Veneklasen .
4,315,152 2/1982 Smith .......................... 250/396 ML

FOREIGN PATENT DOCUMENTS 0085323 8/1983 European Pat. Off. .... 250/396 ML
857254 10/1952 Fed. Rep. of Germany .
697923 9/1953 United Kingdom ........ 250/396 ML
1291221 10/1972 United Kingdom .

OTHER PUBLICATIONS

Optic, vol. 57, No. 3, Dec. 1980, M. Troyon: "High Current Efficiency Field Emission Gun System Incorporation . . . ", pp. 401–419.
Processings of the Symposium on Electron and Ion Beam Science and Technology, vol. 78-5, 1979, H. P. Kuo: "A High Brightness . . . ", pp. 3–9.

Primary Examiner—Bruce C. Anderson
Assistant Examiner—Paul A. Guss
Attorney, Agent, or Firm—Schwartz, Jeffery, Schwaab, Mack, Blumenthal & Evans

[57] ABSTRACT

An electron gun having a field emission cathode is provided with a focusing magnetic lens. In the vicinity of the cathode, a pole piece is defined by two parts. The orifice of the part closer to the cathode is smaller than that positioned downstream. The air gap between the two parts is small and the filament of the cathode extends up to a distance of from about 1.5 to 3 mm from the median plane of the air gap. The excitation of the coil of the focusing magnetic lens is provided such that the image of the electronic source is substantially positioned at the level of the orifice of an intermediate electrode surrounding at least the magnetic lens.

14 Claims, 3 Drawing Figures

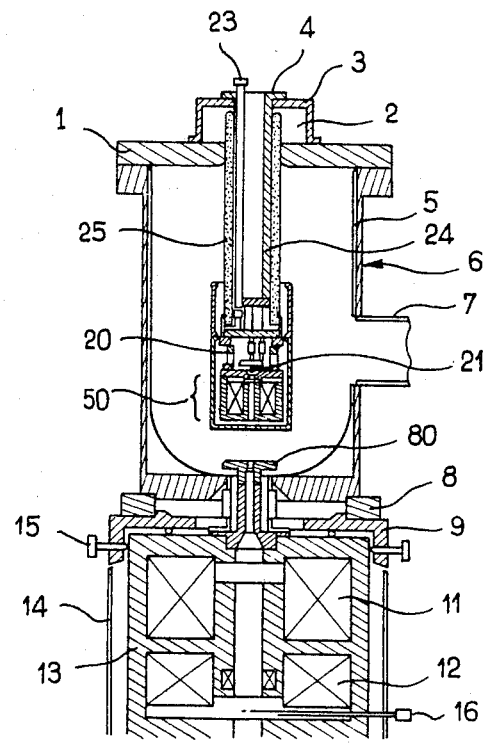
FIG_1
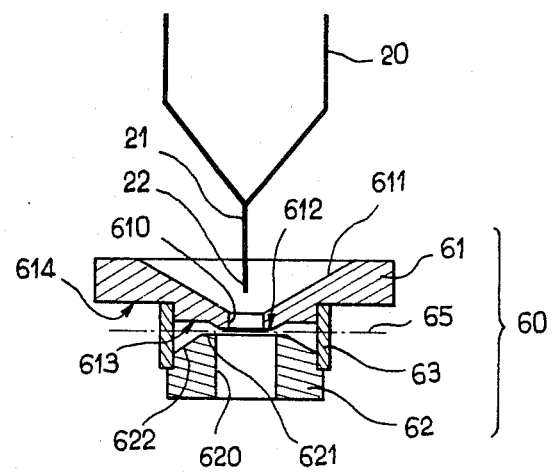
FIG_3

ELECTRON GUN WITH A FIELD EMISSION CATHODE AND A MAGNETIC LENS

BACKGROUND OF THE INVENTION

This invention relates to electron guns which are used notably in all types of electron microscopes.

These electron guns generally comprise a field emission cathode, focusing members, and means for accelerating electrons, the last comprising at least one anode which is brought to a selected potential.

DESCRIPTION OF THE PRIOR ART

British Pat. No. 1,291,221 proposes a system in which focusing is accomplished by a magnetic lens, but which appears to be difficult to use at high values of the acceleration voltage.

In fact, present field emission guns have electrostatic focusing, with resulting disadvantages including aberration.

SUMMARY OF THE INVENTION

This invention provides a more satisfactory solution with magnetic lenses.

In the proposed solution, the magnetic lens which is defined by a coil, a magnetic circuit and a pole piece in two parts with an air gap in between, are positioned coaxially to the coil on the side of the field emission cathode. The magnetic lens is arranged to present two axial orifices and is brought to the electron extraction potential. The electron inlet orifice nearest the cathode has a diameter which is smaller than that of the outlet orifice, with both diameters being less than about 10 mm. The air gap between the two parts of the pole piece, along the axis of the coil, is less than about 3 mm. The distance between the median plane of this air gap and the proximal end of the cathode is less than about 5 mm.

In practice, it is desirable for the inlet orifice to have a diameter of less than 4 mm, preferably from 0.5 to 3.5 mm, and for the outlet orifice to have a diameter ranging from about 3 to 8 mm, preferably from 4 to 6 mm.

For its part, the air gap is at most equal to about 1.5 mm. Moreover, the distance between the median plane of the air gap and the proximal end of the cathode is advantageously from 1.5 to 3 mm.

According to another characteristic to this invention, in advantageous addition to the previous characteristics, an intermediate electrode is provided which surrounds at least the magnetic lens while letting the electrons pass over the axis of the lens. The image point of the cathode which is given by the magnetic lens is positioned substantially at the level of the opening of the intermediate electrode, on the side of the magnetic lens which is opposite the cathode. It is also very advantageous for the intermediate electrode to also surround the cathode and the supply in a practically complete manner.

Other characteristics and advantages of the present invention will be revealed from reading the detailed description which follows, as well as from the accompanying drawings.

BRIEF DESCRIPTION OF THE DRAWINGS

FIG. 1 schematically shows, in the form of an axial sectional view, the general structure of an electron gun with magnetic focusing;

FIG. 3 shows in more detail the cooperation between the pole piece 60 of the magnetic lens and the field emission cathode 20.

DETAILED DESCRIPTION OF THE INVENTION

Figure 2:
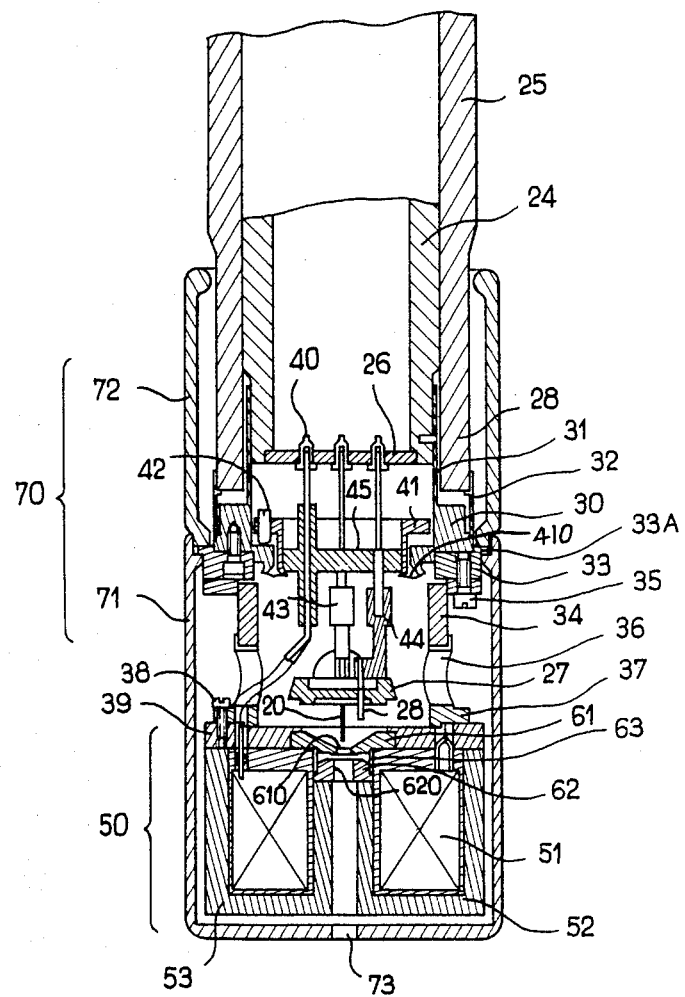
FIG. 2 shows in more detail the essential elements of the electron gun according to the present invention, i.e., its field emission cathode and its focusing lens as well as an auxiliary electrode, this being in the preferred embodiment of the invention.

The upper region of FIG. 1 shows an end plate 1 which is surmounted by a cover 3 forming a reservoir 2 of sulfur hexafluoride, a medium which is preferably; used in high-voltage surroundings. The reservoir and the end plate are pierced axially by a support sleeve 4, made for example of PLEXIGLAS, and which may contain electrical supply cables leading towards the interior of the devices.

Below the end plate 1, an enclosure 6, which is double-walled internally by a casing made of mu-metal 5, defines the location for the field emission cathode and its focusing members. The enclosure 6 is pierced by a wide orifice 7 which permits its engagement with a very high vacuum generating member, for example an ionic pump with titanium sublimation.

Thus, internally, the sleeve 24 is surrounded by an insulating sheath which defines a high-voltage feedthrough 25 made of alumina which only extends up to the inside of the reservoir 2. High-voltage feedthrough 25 simultaneously produces vacuum-tightness. The high-voltage feedthrough 25 serves as a support (FIG. 2) first of all for a field emission cathode 20, the active filament of which is designated by reference numeral 21, and then for a magnetic lens 50, and finally for a peripheral intermediate electrode 70 which surrounds this assembly.

The electrons thus produced will exit vertically in a downwards direction and will reach an anode 80 (FIG. 1). An attachment support 9 is held below the anode by means of a wedge device 8. This support 9 holds a condenser assembly in position, such that it can be adjusted, in particular by screws 15. The condenser assembly is formed by a first condenser coil 11, followed by a second condenser coil 12, after which a device 16 allows the production of an adjustable diaphragm stop. This assembly is surrounded by a casing 14.

The structure of the elements forming the condenser, being conventional, will be apparent to those skilled in the art and will not be described in more detail.

Reference will now be made of FIG. 2 which, like FIG. 1, also shows the PLEXIGLAS sleeve 24 surrounded by the high-voltage feedthrough 25.

The high-voltage feedthrough 25 is extended at its periphery by a thin ring 32 from which an annular device 30 is suspended, being of a slightly complex shape, because it is used as a support, in turn, for all the electrical parts. Moreover, the part 30 comprises a ring 31 which is used as a guide in rotation for the introduction of the sleeve 24 and for establishing the electrical contacts.

Inside, the annular part 30 supports another internal ring 41 by means of an elastic suspension 410. The ring 41 supports an insulating disc 45. Disc 45 is vacuum-tight and is used for the suspension of the cathode 20 by means of electric bushing members, such as 43 and 44. This disc 45 is positioned opposite a homologous disc 26, located in the lower region in the PLEXIGLAS sleeve 24, from which it receives the different electric bushings, such as 40.

The cathode itself is composed of a shoulder support 27 made of insulating material, such as alumina.

This shoulder 27 is provided with electrical bushings, an example of which is shown at 28. This bushing is used for auxiliary supply purposes, and for ensuring an improved suspension of the shoulder 27. Bushings which are of the same type, but are positioned in a plane perpendicular to the figure, support the cathode filament 20, the shape of which is shown more clearly in FIG. 3 which is a section in the plane perpendicular to FIG. 2.

It will be noted that screws, such as 42, allow the displacement of the complete cathode with respect to the support, which makes it possible to precisely adjust the position of the cathode filament 20, which may be effected even during operation by means of Teflon pins, such as the one shown at 23 in FIG. 1.

Secondly, the part 30 supports another ring 33 which, in turn, receives by lower attachment by means of screws, such as 35, a cylinder 34 made of alumina which is pierced by orifices, such as 36. In the lower region, this cylinder receives at 37 all of the magnetic focusing device. This focusing assembly comprises, below a metallic plate 39, magnetic circuits 53 which, inside, house a coil 51 in a tight body 52. The magnetic circuit is interrupted in a conventional manner on the side of the axis of the coil 51 where the cathode filament 20 arrives. At this level, the magnetic circuit is defined by a pole piece which is in fact composed of two parts designated by reference numerals 61 and 62, and is maintained in relative position by a crosspiece 63, this assembly being shown in more detail in FIG. 3.

In FIG. 2, it will also be noted that the electrical bushing 40 permits the supply of current to the coil, as well as of the high voltage feed to all of the coil device, with one of the wires running towards the attachment screw 38, and the other running directly towards the coil 51.

The part 33 also comprises a radial shoulder towards the outside designated by 33A which serves as a support for an intermediate electrode which is generally designated by reference numeral 70. In fact, this electrode is in two parts 71 and 72 which are held in place by screwing one part onto the other, while tightening the shoulder 33A. The lower part 71 is provided in the lower region with an orifice 73 which is positioned on the axis of the coil.

Referring now to FIG. 3, it will be seen that according to one of the significant characteristics of the present invention, the pole piece 60 is asymmetric with respect to the horizontal axis. In effect, it comprises an upper pole 61 which is pierced by a hole 610, the diameter of which preferably varies from about 1.5 to 3 mm. However, greater values may be envisaged in some cases, as has already been indicated. The upper pole 61 is bound to the lower pole 62 by a titanium ring 63, and the diameter of the hole 620 of the lower pole is about 5 mm. As previously indicated, slightly different values may be envisaged.

Finally, the value of the air gap is about a millimeter. In this case, the air gap is measured between the lower plane of the upper pole 61 and the upper plane of the lower pole 62.

The axis line 65 will also be noted, which defines the median plane of the pole piece, or of the air gap.

In practice, the upper pole 61 or the first part of the pole piece comprises at the top a concave recess 611 in the shape of a truncated cone which is joined to the orifice 610 and allows the introduction of the cathode filament 20 as near as possible to the orifice. (The cathode filament is considerably enlarged with respect to the size of the pole piece).

In the lower region, the upper pole 61 comprises a plate 612 which extends radially perpendicularly to the axis and surrounds the orifice 610. This plate 612 is followed consecutively by two set-backs 613 and 614 which are also flat, but are in a recessed position with respect to the other pole 62, and which are interconnected by an axial cylindrical zone which is used as a support for the ring 63.

For its part, the second pole 62 also comprises a plate 621 which extends radially perpendicularly to the axis and surrounds the orifice 620. This plate is followed by a recessed zone 622 which is again terminated by a shoulder ensuring the positioning of the titanium ring 63.

It is desirable to use the magnetic lens at a short focal length, which implies that the nearest end 22 of the axial part 21 of the cathode filament 20 is to be positioned at a distance of from about 1.5 to 3 mm from the median plane 65 of the air gap of the magnetic lens.

This invention makes it possible to obtain low values of the spherical aberration coefficient $C_s$ and of the chromatic aberration coefficient $C_c$, i.e. values of about a few millimeters. For example, it has been possible to obtain a coefficient $C_s$ of 3 mm and a coefficient $C_c$ of 1.8 mm.

Consequently, it is possible to obtain a much greater electron probe current, bearing stopping down in mind. The electron probe current is at least four times greater than those currents which are obtained with field emission guns and electrostatic lenses which are used at present (assuming probes having a diameter of more than about 10 nm).

The practical performances of a gun which has already been produced are as follows:

very great brightness: $10^8$ $A \times cm^{-2} \times sr^{-1}$ for an acceleration voltage of 100 kV.

Strong beam current, i.e. up to $10^{-6}$ A in a probe of 200 nm.

Ultra-high vacuum which permits a pressure below $10^{-10}$ torr.

Acceleration voltage up to 120 kV over a single stage.

The arrangement which is proposed according to the present invention also has the advantage of the a priori production of a good stability of the downstream focusing point in the lens, i.e. of the image electronic source which is given of the cathode by the magnetic lens.

The intermediate electrode 70 which has already been mentioned is preferably provided and is positioned immediately after the magnetic lens and defines at 73 an orifice on the axis of the lens. By exciting the coil so that the downstream focusing point is positioned at the level of this orifice 73 or near said orifice, the stability of the position of the image electronic source is further considerably increased. If, for example, the final acceleration voltage is denoted $V_i$ and the electron extraction voltage is $V_o$, the voltage ratio $V_i/V_o$ may vary between 4 and 50 without the position of the image electronic source varying by more than 5 mm along the optical axis.

Moreover, by raising, as indicated at 72, the intermediate electrode until it is largely above the cathode, the cathode is protected against possible high voltage break-downs.

The present invention may be used in all applications of electron guns, in particular where there is a need for an intense electronic current over a probe diameter of less than 0.2 micrometers. More particularly, the areas of use of the present invention notably include the following: conventional electron microscopy and scanning microscopy, X-ray microanalysis, Auger spectroscopy and microlithography.

We claim:

1. An electron gun, comprising a field emission cathode, focusing members having a magnetic lens which are positioned in the vicinity of the cathode, and means for accelerating electrons comprising at least one anode which is brought to a selected potential, the magnetic lens being defined by a coil, a magnetic circuit and a pole piece in two parts having an air gap therebetween, the magnetic lens being positioned coaxially to the coil on the side of the field emission cathode and the two-part pole piece presenting electron inlet and outlet axial orifices, said magnetic lens being adapted to assume the electron extractor potential, wherein said electron inlet orifice, nearer the cathode, has a diameter smaller than that of the outlet orifice, these diameters both being less than about 10 mm, the air gap between the two parts of the pole piece, along the axis of the coil, is less than about 3 mm, and the distance between the median plane of this air gap and the nearest end of the cathode is less than about 5 mm.

2. An electron gun according to claim 1, wherein the inlet orifice has a diameter of less than 4 mm, and the outlet orifice has a diameter of from about 3 to 8 mm.

3. An electron gun according to claim 2, wherein the inlet orifice has a diameter of from 0.5 to 3.5 mm, and the outlet orifice has a diameter of from 4 to 6 mm.

4. An electron gun according to claim 1, wherein the air gap is at most equal to about 1.5 mm.

5. An electron gun according to claim 1, wherein the distance between the median plane of the air gap and the nearest end of the cathode is from 1.5 to 3 mm.

6. An electron gun according to claim 1, wherein the part of the pole piece nearer the cathode defines on the cathode side a hollow in the shape of a truncated cone joining said inlet orifice, and on the opposite side, in the vicinity of the outlet orifice and towards said orifice, a flat axial rise, substantially equal in diameter to that of the outlet orifice, followed laterally by recessed set-backs, and the further part of the pole piece comprises, on the side of the inlet orifice, a radial plate slightly wider than said rise, and centered on the outlet orifice, this radial plate joining a zone which is recessed with respect to said nearer part, whereas a crosspiece is mounted between the recessed zone of the further part and the recessed set-back of the nearer part.

7. An electron gun comprising:
a field emission cathode for generating electrons;
a magnetic lens positioned in the vicinity and downstream with respect to a direction of electron flow of said cathode, said magnetic lens being defined by a coil, a magnetic circuit, and a pole piece comprising a first part and a second part defining an air gap therebetween, said first part being nearer said cathode than said second part,
said magnetic lens being adapted to produce a focusing magnetic field coaxially with the coil on a side of said coil facing said cathode,
said first part defining an axial electron inlet orifice, and said second part defining an axial electron outlet orifice,
said magnetic lens being adapted to assume an electrode potential substantially equal to an electron extractor potential,
said inlet orifice having a diameter smaller than that of said outlet orifice, and said outlet orifice having a diameter smaller than about 10 mm,
said air gap having a thickness measured parallel to an axis of said coil which is less than about 3 mm and having a median plane which is less than about 5 mm from a nearest end of said cathode; and
an intermediate electrode arranged to surround said magnetic lens, and provided with a member defining an opening aligned with and downstream of said outlet orifice,
said coil of the magnetic lens, when excited, being adapted to allow the image point of the cathode given by the magnetic lens to be positioned at the level of said opening of said intermediate electrode.

8. An electron gun according to claim 7, wherein the inlet orifice has a diameter of less than 4 mm, and the outlet orifice has a diameter of from about 3 to 8 mm.

9. An electron gun according to claim 8, wherein the inlet orifice has a diameter of from 0.5 to 3.5 mm, and the outlet orifice has a diameter of from 4 to 6 mm.

10. An electron gun according to claim 7, wherein the air gap is at most equal to about 1.5 mm.

11. An electron gun according to claim 7, wherein the distance between the median plane of the air gap and the nearest end of the cathode is from 1.5 to 3 mm.

12. An electron according to claim 7, wherein said intermediate electrode surrounds the cathode in a practically complete manner.

13. An electron gun according to claim 7, wherein the first part of the pole piece defines on the cathode side a hollow in the shape of a truncated cone joining said inlet orifice, and on the opposite side, in the vicinity of the outlet orifice and towards said orifice, a flat axial rise, substantially equal in diameter to that of the outlet orifice, followed laterally by recessed set-backs, and wherein the second part of the pole piece comprises, on the side of the inlet orifice, a radial plate slightly wider than said rise, and centered on the outlet orifice, this radial plate joining a zone which is recessed with respect to said first part, whereas a crosspiece is mounted between the recessed zone of the second part and the recessed set-back of the first part.

14. An electron gun comprising a field emission cathode, focusing members having a magnetic lens which are positioned in the vicinity of the cathode, and means for accelerating electrons comprising at least one anode which is brought to a selected potential (Vi), the magnetic lens being defined by a coil, a magnetic circuit and a pole piece having two parts separated by an air gap, the magnetic lens being positioned coaxially to the coil on the side of the field emission cathode and the pole piece presenting electron inlet and outlet axial orifices, said magnetic lens being adapted to assume an electron extractor potential (Vo), wherein said inlet orifice has a diameter of from 0.5 to 3.5 mm and the outlet orifice has a diameter of from 4 to 6 mm, said air gap between the two parts of the pole piece along the axis of the coil being at most equal to about 1.5 mm, and the distance between the median plane of this air gap and the nearest end of the cathode being from 1.5 to 3 mm, said magnetic lens at least being further surrounded by an intermediate electrode on the side thereof which is opposite the cathode, said coil of the magnetic lens, when excited, being adapted to allow the image point of the cathode given by the magnetic lens to be positioned at the level of said opening of said intermediate electrode thereby allowing the position of said image point to vary by not more than 5 mm along the optical axis for a variation range between 4 and 50 of the ratio $V_i/V_o$ of said anode selected potential and extractor potential.

* * * * *

UNITED STATES PATENT AND TRADEMARK OFFICE
CERTIFICATE OF CORRECTION

PATENT NO. : 4,544,845
DATED : October 1, 1985
INVENTOR(S) : Michel E. TROYON

It is certified that error appears in the above-identified patent and that said Letters Patent is hereby corrected as shown below:

On the Title Page, Item [75], "Troyon E. Michel" should read --Michel E. Troyon--.

Item [73] "University" should read --Universite--.

Signed and Sealed this

Twenty-ninth Day of July 1986

[SEAL]

Attest:

DONALD J. QUIGG

Attesting Officer

Commissioner of Patents and Trademarks